310-322 SR
10/31/78 OR 4,123,681

United States Patent [19] [11] 4,123,681
Barlow [45] Oct. 31, 1978

[54] WIDE BAND PROPORTIONAL TRANSDUCER ARRAY

[75] Inventor: Michael L. Barlow, Silverdale, Wash.

[73] Assignee: The United States of America as represented by the Secretary of the Navy, Washington, D.C.

[21] Appl. No.: 743,441

[22] Filed: Nov. 19, 1976

Related U.S. Application Data

[63] Continuation of Ser. No. 501,918, Aug. 29, 1974, abandoned.

[51] Int. Cl.² .................... H01L 41/10

[52] U.S. Cl. .................... 310/322; 310/369

[58] Field of Search .................... 310/8.1, 8.2, 8.3, 8.7, 310/9.1, 9.4, 9.5, 9.6, 322, 334, 369; 340/8 R, 8 FT, 9, 10; 333/72

[56] References Cited

U.S. PATENT DOCUMENTS

| | | | |
|---|---|---|---|
| 3,136,381 | 6/1964 | Anderson | 310/9.6 X |
| 3,243,768 | 3/1966 | Roshon, Jr. | 310/9.6 X |
| 3,277,428 | 10/1966 | Samsell | 340/8 R |
| 3,277,451 | 10/1966 | Parssinen | 340/8 R |
| 3,327,286 | 6/1967 | Dorr et al. | 340/8 R |
| 3,449,712 | 6/1969 | Angeloff | 340/8 R |
| 3,496,527 | 2/1970 | Ziehm | 340/8 R |
| 3,760,345 | 9/1973 | Hughes | 340/9 X |

*Primary Examiner*—Mark O. Budd
*Attorney, Agent, or Firm*—R. S. Sciascia; Charles D. B. Curry

[57] ABSTRACT

A wide band proportional transducer array including a plurality of active acoustic elements. The elements are concentrically mounted to form a conical array. A proportionality constant $k$ is selected to be such that a nearly constant composite array impedence is achieved. The proportionality constant relates to the ratio of the resonant frequencies of adjacent elements and inversely as the ratio to their physical sizes. Another embodiment employs a pair of conical arrays which results in a toroidal beam.

2 Claims, 4 Drawing Figures

WIDE BAND PROPORTIONAL TRANSDUCER ARRAY

This is a continuation of application Ser. No. 501,918 filed Aug. 29, 1974, now abandoned.

BACKGROUND OF THE INVENTION

1. Field of the Invention

The present invention relates to a transducer array and more particularly to a wide band proportional transducer array.

2. Description of the Prior Art

Prior wide band transducer array systems have employed separate arrays wherein each array required a complicated switching network to achieve operation over a wide range of frequencies. The present invention overcomes this difficulty by providing an array that operates over a wide frequency range without causing a complicated switching network.

SUMMARY OF THE INVENTION

Briefly, the present invention comprises a wide band proportional transducer array including a plurality of active acoustic elements. The elements are concentrically mounted to form a conical array. A proportionally constant $k$ is selected to be such that a nearly constant composite array impedance is achieved. The proportionality constant relates to the ratio of the resonant frequencies of adjacent elements and inversely as the ratio to their physical sizes. Another embodiment employs a pair of conical arrays which results in a toroidal beam.

STATEMENT OF THE OBJECTS OF THE INVENTION

An object of the present invention is to provide a wide band transducer array;

Another object of the present invention is to provide a transducer array that does not require mechanical switching;

Still another object of the present invention is to provide a transducer array that has a relatively constant composite impedence over its frequency range;

Other objects, advantages and novel features of the present invention will become apparent from the following detailed description of the invention when considered in conjunction with the accompanying drawings wherein:

DESCRIPTION OF THE PREFERRED EMBODIMENT

Figure 1:
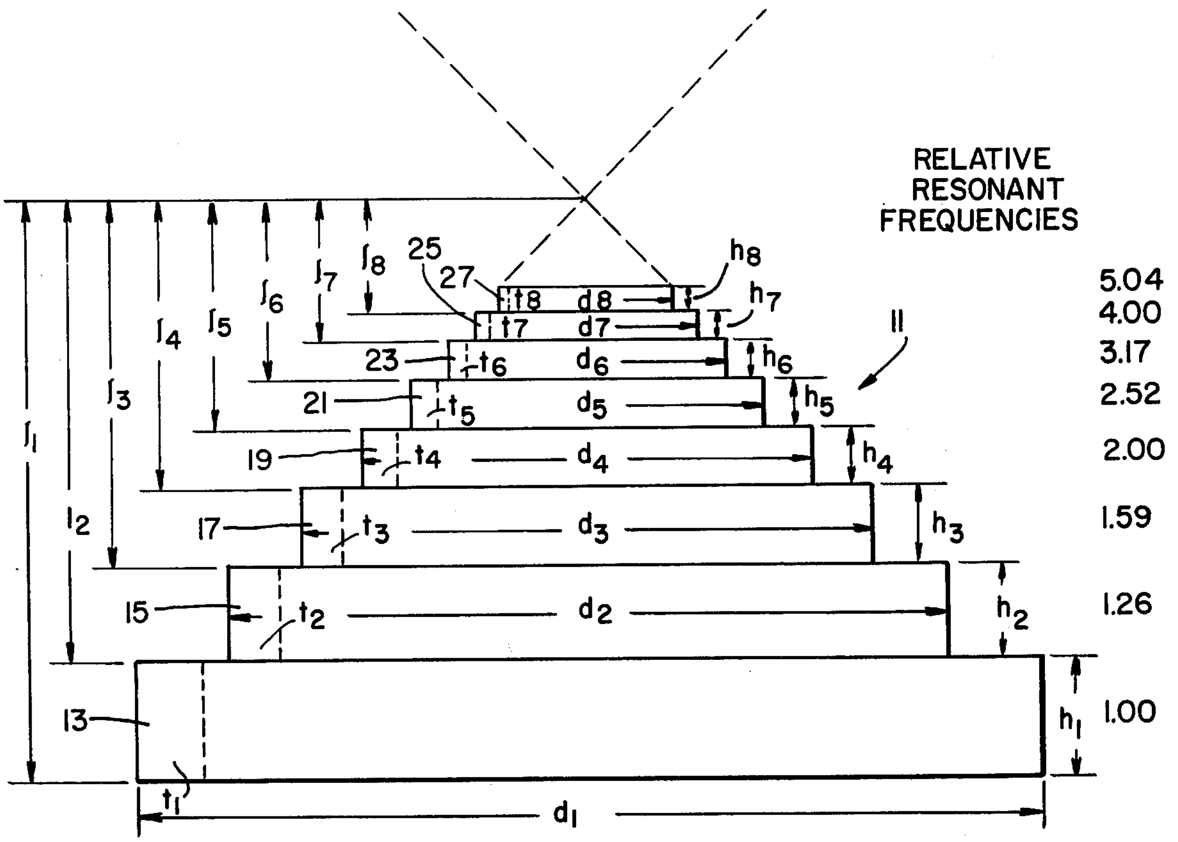
FIG. 1 is a schematic diagram of a simple cone transducer array embodiment of the present invention.
Figure 2:
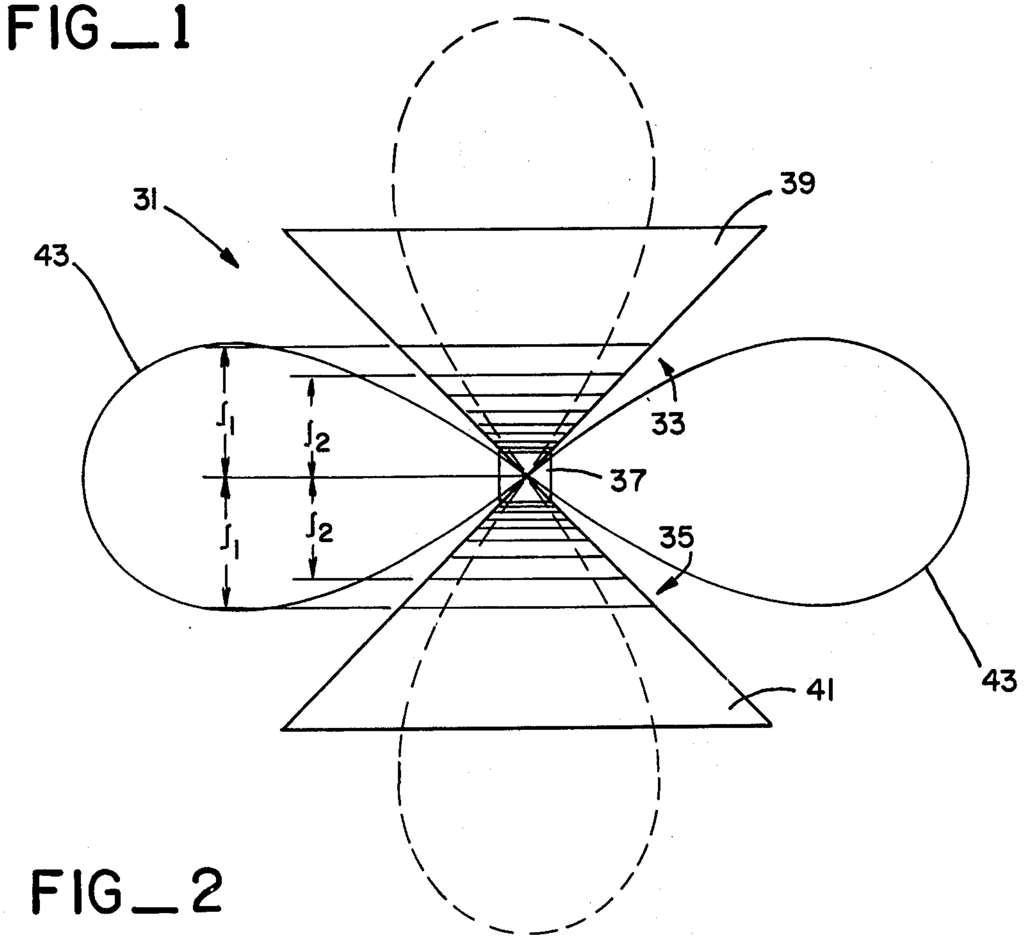
FIG. 2 is a schematic diagram of a two cone transducer array embodiment of the present invention.

In FIG. 1 is schematically illustrated one embodiment of the present invention. This embodiment includes a single cone array 11 comprising a plurality of active electro-acoustic transducer elements 13 through 27 which may be piezoelectric elements, for example. In FIG. 2 is illustrated another embodiment of the present invention wherein a two cone array 31 is employed. This array 31 has the elements arrayed in two cones, 33 and 35, that are similar to each other and to the array 11 of FIG. 1. The FIG. 2 array 31 has a physical spacer 37 connecting and physically spacing the two cones 33 and 35 apart. Physical baffles 39 and 41 are respectively connected to the exterior surface of the outer elements of each of the cones 33 and 35. The function of the baffles is to suppress the unwanted side lobes, shown in dotted lines, and allow formation of the toroidal beam 43.

The following description will be primarily with respect to the FIG. 1 embodiment but will also be applicable to the FIG. 2 embodiment. The elements 13 through 27 are rings having thickness $t_1$ through $t_8$, diameters $d_1$ through $d_8$ and heights $h_1$ through $h_8$. Moreover, the elements 13 through 27 have resonant frequencies of $f_1$ through $f_8$, respectively. One of the unique aspects of the present invention is the selection of a proportionality constant $k$ to be such that a nearly constant composite array impedence is achieved. The proportionality constant $k$ relates to the ratio of the resonant frequencies of adjacent elements and inversely as the ratio of their physical sizes. Referring to FIG. 1, $$k = \frac{h_1}{h_2} = \frac{h_2}{h_3} \cdots \frac{h_7}{h_8} = \frac{d_1}{d_2} = \frac{d_2}{d_3} \cdots \frac{d_7}{d_8} = \frac{l_1}{l_2} = \frac{l_2}{l_3} \cdots \frac{l_7}{l_8} = \frac{t_1}{t_2} = \frac{t_2}{t_3} \cdots \frac{t_7}{t_8} = \frac{f_2}{f_1} = \frac{f_3}{f_2} \cdots \frac{f_8}{f_7}$$

The proportionality constant $k$ is selected to minimize the impedence variation at the crossover frequencies of adjacent elements and to minimize the number of required elements. It is desirable to select the same proportionality factor between all adjacent elements to maintain a constant impedence, a constant transmitting sensitivity, and a uniform beam pattern over the selected frequency range. The lower limit of $k$ is determined by the acceptable number of array elements and the upper limit is determined by the maximum allowable composite impedence variation.

Figure 3:
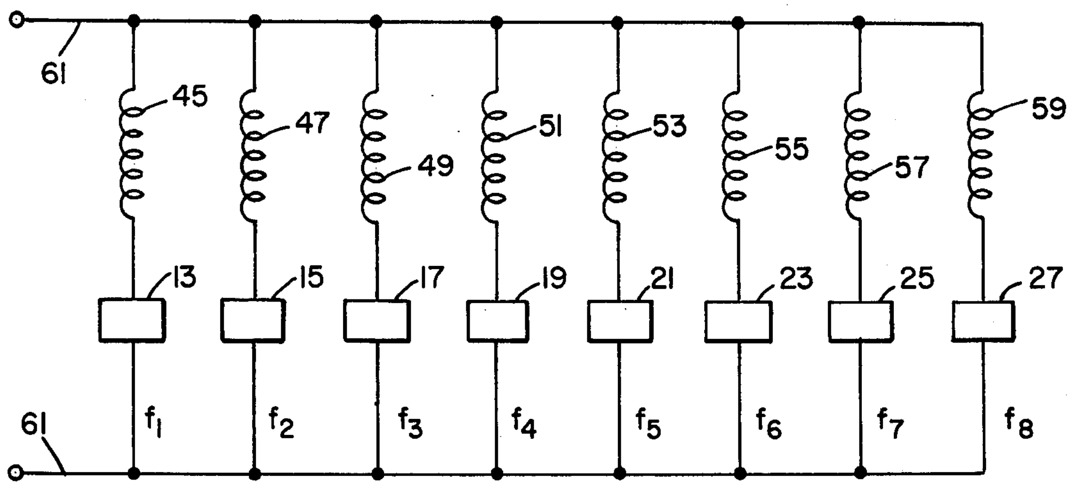
FIG. 3 is an electrical diagram showing the operation of the embodiments of FIGS. 1 and 2.
Figure 4:
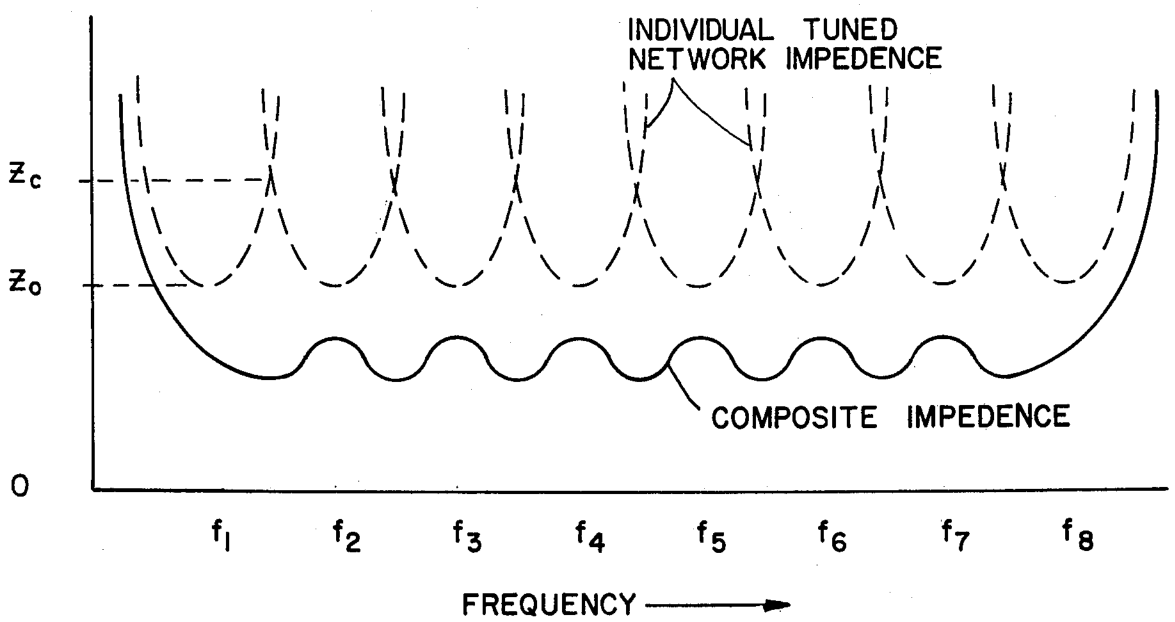
FIG. 4 is a group of curves showing the operation of the embodiments of FIGS. 1 and 2.

In FIG. 3 is illustrated an electrical diagram of the FIG. 1 array. The elements 13 through 27 of this array are tuned in series by inductors 45 through 59 wherein these tuned elements are connected in parrallel to a common bus. The bus may be connected to a receiver or transmitter. When the elements are connected as shown in FIG. 3 they will have individual tuned impedences as shown by the dotted line curves of FIG. 4. Moreover, the composite impedence of all of the tuned elements will be as illustrated by the solid line curve of FIG. 4. In FIG. 4 the impedence $f_o$ represents the individual tuned network impedence at resonance and the crossarm impedence $f_c$ has a maximum that is dependent upon the maximum allowable composite impedence which is determined by the selection of the proportionality constant $k$. It has been found that $k$ having a value of about $\sqrt[3]{2}$ or about 1.26 results in an effective array having about eight elements and a substantially constant composite impedence over a 5 to 1 frequency range. This range is highly compatible with most sonar applications.

Referring to FIGS. 1 through 4, it should by noted that at any given frequency of operation that primarily only one or two of the array elements will be operating. For example, at the frequency $f_4$ of FIG. 4 only element 19 will be operating. However, at a frequency between $f_4$ and $f_5$, then elements 19 and 21 will be simultaneously operating.

It should be noted that the individual array elements may be tuned in parallel and connected in series to obtain a similar composite impedence and operation.

This could be done if it is desired to increase the impedence of the array.

It should be understood that the above described configuration is generally desirable; however, it will be understood by those skilled in the art that certain deviations may be made. For example, all of the elements may be placed in essentially a common plane or positioned in spaced apart relationships. Also, the above described invention may be applied to non-cylindrical elements.

It will be understood by those skilled in the art that an array may be made in accordance with the present invention wherein there may be some variation in the proportionality constants between adjacent elements of an array. However, in principle it is generally preferable to maintain the proportionality constant the same.

What is claimed is:

1. A transducer array comprising:

(a) at least three transducer elements;

(b) each of said elements having a discrete resonant frequency that is different from the discrete resonant frequency of any other of said transducer elements;

(c) said elements being arranged so that the ratio of the resonant frequencies of adjacent elements is substantially constant;

(d) a passive electrical network operatively connected to said transducer elements to provide the electrical drive voltages and currents to each of said transducer elements for operating predetermined elements at their resonant frequencies over said band width;

(e) said ratio is selected to have a predetermined value of about 1.26 such that the composite impedence of said array is about constant over its entire band width;

(f) said elements are arranged to form at least one cone wherein said elements of said at least one cone are of progressively decreasing size and progressively increasing frequency;

(g) the ratio of the heights, diameters and thicknesses of adjacent elements are substantially constant;

(h) the ratio of said frequencies is about inversely proportional to the ratios of said heights, diameters and thicknesses; and (i) said transducer array is for operating only as a receiver or only as a transmitter at any instant of time.

2. The array of claim 1 wherein:

(a) said array has a first cone of a plurality of elements and a second cone of a plurality of elements; and (b) the small ends of said first and second cones being spaced apart and adjacent.

* * * * *